United States Patent
Bechtel et al.

(10) Patent No.: US 9,406,849 B2
(45) Date of Patent: Aug. 2, 2016

(54) PHOSPHOR CONVERTED LIGHT EMITTING DIODE, A LAMP AND A LUMINAIRE

(71) Applicant: KONINKLIJKE PHILIPS N.V., Eindhoven (NL)

(72) Inventors: Hans-Helmut Bechtel, Eindhoven (NL); Matthias Heidemann, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 14/419,951

(22) PCT Filed: Aug. 6, 2013

(86) PCT No.: PCT/IB2013/056441
§ 371 (c)(1),
(2) Date: Feb. 6, 2015

(87) PCT Pub. No.: WO2014/024138
PCT Pub. Date: Feb. 13, 2014

(65) Prior Publication Data
US 2015/0171284 A1    Jun. 18, 2015

Related U.S. Application Data

(60) Provisional application No. 61/681,695, filed on Aug. 10, 2012.

(51) Int. Cl.
*H01L 33/50*    (2010.01)

(52) U.S. Cl.
CPC ....... *H01L 33/504* (2013.01); *H01L 2924/0002* (2013.01)

(58) Field of Classification Search
CPC ................. H01L 2224/48091; H01L 2924/00; H01L 2924/00014; H01L 2924/0002; H01L 33/504
See application file for complete search history.

(56) References Cited

U.S. PATENT DOCUMENTS

| 8,648,367 B2 | 2/2014 | Oberleitner |
| 2009/0231832 A1 | 9/2009 | Zukauskas et al. |
| 2011/0180780 A1 | 7/2011 | Yoo et al. |
| 2011/0227476 A1 | 9/2011 | Zhang et al. |

FOREIGN PATENT DOCUMENTS

| DE | 102008021662 A1 | 11/2009 |
| EP | 1710291 A2 | 11/2006 |
| WO | 0211214 A1 | 2/2002 |

*Primary Examiner* — Tony Tran

(57) ABSTRACT

A phosphor converted Light Emitting Diode (LED), a lamp and a luminaire are provided. The phosphor converted LED 106 comprises a LED 102, a first luminescent material 166, a second luminescent material 164 and a third luminescent material 162. The LED 102 emits a first spectral distribution having a first peak wavelength in the blue spectral range. The first luminescent material 166 absorbs a portion of the light of the first spectral distribution and converts at least a portion of the absorbed light towards light of a second spectral distribution. The second spectral distribution has a second peak wavelength in the green spectral range. The second luminescent material 164 absorbs absorbing a portion of the light of the first spectral distribution and/or a portion of the second spectral distribution. The second luminescent material 164 converts at least a portion of the absorbed light towards lights of a third spectral distribution. The third spectral distribution has a third spectral width and has a third peak wavelength. The third luminescent material 162 absorbs a portion of the light of at least one of the first spectral distribution, second spectral distribution, and the third spectral distribution. The third luminescent material 162 converts at least a portion of the absorbed light towards light of a fourth spectral distribution. The fourth spectral distribution has a fourth spectral width and has a fourth peak wavelength. The third peak wavelength and the fourth peak wavelength are in the orange/red spectral range. The third peak wavelength is smaller than the fourth peak wavelength and the third spectral width is larger than the fourth spectral width.

14 Claims, 7 Drawing Sheets

500

PHOSPHOR CONVERTED LIGHT EMITTING DIODE, A LAMP AND A LUMINAIRE

CROSS-REFERENCE TO PRIOR APPLICATIONS

This application is the U.S. National Phase application under 35 U.S.C. §371 of International Application No. PCT/IB2013/055761, filed on Aug. 6, 2013, which claims the benefit of U.S. Patent Application No. 61/681,695, filed on Aug. 10, 2012. These applications are hereby incorporated by reference herein.

FIELD OF THE INVENTION

The invention relates to phosphor converted Light Emitting Diodes having a relatively large Color Rendering Index. The invention further related to the use of the phosphor converted Light Emitting Diodes in lamps and luminaires.

BACKGROUND OF THE INVENTION

Phosphor converted Light Emitting Diodes (LEDs) comprise luminescent materials such as inorganic phosphors to convert a portion of the light emitted by the LED into light of another color to obtain a specific light emission. Many phosphor converted LEDs are used to obtain an emission of light with a color point close to the black body line in a color space—hence, light which appears to be white to the human naked eye. The phosphor material is often applied directly on the Light Emitting Diode, however, the invention disclosed in this document is not directly limited to such embodiments.

Currently, the above discussed phosphor converted LEDs are based on blue light emitting LEDs which are combined with luminescent materials which convert a portion of the blue light to green and to red light to generated white light which has a relatively high color rendering index, for example, larger than 80. One example of such phosphor converted LEDs is a LED which emits blue light with a peak wavelength of 449 nanometer, which comprises a green emitting phosphor $Y_3AL_5O_{12}:CE^{3+}$ and a red emitting phosphor $CaAlSiN_3:Eu^{2+}$. The red emitting phosphor emits red light according to a spectral distribution which has a peak wavelength at 620 nanometer and a width of 93 nanometer (expressed as a Full Width Half Maximum, FWHM, value). By combining specific amounts of the phosphors, a phosphor converted LED may be manufactured which emits light at the correlated color temperature CCT=3000 Kelvin. The total light emission power of this specific phosphor converted LED comprises about 11% light from the blue emitting LED, 43% light from the red emitting phosphor and about 46% light from the green emitting phosphor. The total lumen equivalent is 322.2 lumen per Watt and the Color Rending Index (expressed as an RA value) is 82.1.

The lumen equivalent strongly depends on the amount of light that the red emitting phosphor emits in the deep red region. The deep red spectral range starts at about 650 nanometer, with the eye sensitivity dropping below 10 percent of its maximum. If the amount of light emitted in the deep red region can be limited, the lumen equivalent is potentially higher.

In order to improve the lumen equivalent, it is know that Quantum Dots (QDs) can be used because quantum dots have a relatively narrow light emission spectrum. There are, for example, QDs which emit light with a peak wavelength in the range from 610 to 620 nanometer and have a light emission spectrum which has a width of 30 nanometer FWHM. For example, when a phosphor converted LED is manufactured, which comprises a blue emitting LED which emits a peak wavelength of 449 nanometer, which comprises a green phosphor $Y_3Al_5O_{12}:Ce^{3+}$, which comprises red emitting quantum dots with have a emission spectrum with a peak emission of 612 nanometer and a width of 30 nanometer FWHM and which is configured to emit light at the CCT of 3000 Kelvin, the emitted light has the same color rendering index as the phosphor converted LED of the previous paragraph (CR-$I_{RA}$=82.1), and the lumen equivalent increased towards 364.9 lumen per Watt. Thus, if two phosphor converted LEDs in accordance with the previous two embodiments are provided with the same amount of electrical energy, the human naked eye experiences the emitted light by the last phosphor converted LEDS as more bright light.

However, the quantum dot material is not yet reliable enough to guarantee a long life time of the phosphor converted LED. Further, the most efficient quantum dot materials today available comprise Cadmium and/or Selenide which have known environmental compatibility issues. Furthermore, known alternative luminescent materials which emit red light at a relatively high peak wavelength and which emit light in a narrow band have also stability problems.

SUMMARY OF THE INVENTION

It is an object of the invention to provide phosphor converted Light Emitting Diodes (LEDs) which are more stable than the know phosphor converted LEDs while maintaining a relatively high lumen equivalent and a relatively high color rendering index.

A first aspect of the invention provides a phosphor converted Light Emitting Diode. A second aspect of the invention provides a lamp. A third aspect of the invention provides a luminaire. Advantageous embodiments are defined in the dependent claims.

A phosphor converted Light Emitting diode (LED in accordance with the first aspect of the invention comprises a LED, a first luminescent material, a second luminescent material and a third luminescent material. The LED emits a first spectral distribution having a first peak wavelength in the blue spectral range. The first luminescent material absorbs a portion of the light of the first spectral distribution and converts at least a portion of the absorbed light towards light of a second spectral distribution. The second spectral distribution has a second peak wavelength in the green spectral range. The second luminescent material absorbs absorbing a portion of the light of the first spectral distribution and/or a portion of the second spectral distribution. The second luminescent material converts at least a portion of the absorbed light towards lights of a third spectral distribution. The third spectral distribution has a third spectral width and has a third peak wavelength. The third luminescent material absorbs a portion of the light of at least one of the first spectral distribution, second spectral distribution, and the third spectral distribution. The third luminescent material converts at least a portion of the absorbed light towards light of a fourth spectral distribution. The fourth spectral distribution has a fourth spectral width and has a fourth peak wavelength. The third peak wavelength and the fourth peak wavelength are in the orange/red spectral range. The third peak wavelength is smaller than the fourth peak wavelength and the third spectral width is larger than the fourth spectral width.

The phosphor converted LED according to the first aspect comprises two different luminescent materials which convert blue light towards orange/red and red light. The third luminescent material, comprising quantum dots for example, has the highest peak wavelength and, thus, emits light which is close to the deep red spectral range. The spectral distribution of the third luminescent material has a relatively narrow light emission distribution, especially compared to the second luminescent material. Thus, the third luminescent material does not emit much light in the deep red spectral range, and, thus, the lumen equivalent is not reduced because of a too large light emission in the deep red spectral range. The second luminescent material has a lower peak wavelength in the orange/red or red spectral range and has a wider light emission distribution (compared to the third luminescent material) and, consequently, the second luminescent material emits light in the lower red spectral range and partly in the spectral range in which the third luminescent material also emits light. Thus, the second luminescent material contributes to a high enough light emission along the whole red spectral range and possibly also in the orange spectral range. Thereby, the color rendering index of the light emitted by the phosphor converted LED remains relatively high. Furthermore, by using a second luminescent material which emits also some light in the spectral distribution of the third luminescent material, the required amount of the third luminescent material may be reduced which is especially advantageous if the third luminescent material is expensive or has specific disadvantages. If the amount of the third luminescent material is relatively low, possible stability issues with this material have less influence on the life-time of the phosphor converted LED as a whole, and the phosphor converted LED as a whole is more stable compared to phosphor converted LEDs which have much more luminescent material which emits light in a relatively narrow spectral distribution in the orange/red spectral range.

In other words, instead of using a single red emitting phosphor, a hybrid solution is applied in the phosphor converted LED of the first aspect of the invention wherein one of the two luminescent materials emits enough light at relatively high wavelengths, but prevents the emission of much light in the deep red spectral range and wherein the other luminescent material is used to emit enough light in the whole red spectral range (and possibly the orange spectral range) such that the color rendering index is not reduced and the amount of required quantum dots is reduced. It is to be noted that the second and third luminescent material have to be used in the specific combination as disclosed. If one of the luminescent materials would not be used and the amount of the other one of the luminescent materials has to be increased and, thus, it would result in one of the undesired effects of a reduced color rendering index, a reduced lumen equivalent or a too large use of the third luminescent material.

It is to be noted that the term spectral distribution refers to the distribution of the amount of light at specific wavelengths of light. The amount of light may be expressed as the amount of energy emitted at the specific wavelength. Such a spectral distribution may also be a normalized distribution. The visible light spectrum may be subdivided in several spectral sub ranges in relation to the color which is seen by the human naked eye. The blue spectral range comprises light with a wavelength in the range from 400 nanometer to 500 nanometer. The green spectral range comprises light with a wavelength in the range from 500 nanometer to 570 nanometer. The orange spectral range comprises light with a wavelength in the range from 570 nanometer to 620 nanometer. The red spectral range comprises light with a wavelength in the range from 620 nanometer to 750 nanometer. The orange/red spectral range comprises light in the spectral range from 570 to 750 nanometer.

Optionally, the second and/or the third luminescent material comprises a red emitting $Eu^{2+}$ phosphor.

Optionally, the second luminescent material comprises the material $M_2Si_5N_8:Eu^{2+}$ (M=alkaline earth metal). (It has been found by the inventors that the phosphors of the material of this optional embodiment is especially useful in the invention as claimed. The specific emission properties of the material are set by the combination of alkaline earth atoms and concentration of the Eu activator. The material is configured to absorb blue light, is stable and provides an advantageous wide light emission distribution in the orange and red spectral range such that, when being combined with a narrow red emitting luminescent material and a green emitting luminescent material, a phosphor converted LED may be manufactured with a relatively high Color Rendering Index and a relatively high lumen equivalent.

Optionally, the second luminescent material comprises the material $(Ca,Sr)AlSiN_3:Eu^{2+}$.

Optionally, the third luminescent material comprises particles showing quantum confinement and having at least in one dimension a size in the nanometer range.

Quantum confinement means that the particles have optical properties that depend on the size of the particles. Examples of such materials are quantum dots, quantum rods and quantum tetrapods. The third luminescent material comprises at least particles that have at least in one dimension a size in the nanometer range. This means, for example, that, if the particles are substantially spherical, their diameter is in the nanometer range. Or, this means, for example, if they are wire-shaped, that a size of a cross-section of the wire is in one direction in the nanometer range. A size in the nanometer range means that their size is at least smaller than 1 micrometer, thus, smaller than 500 nanometer, and larger or equal to 0.5 nanometer. In an embodiment, the size in one dimension is smaller than 50 nanometer. In another embodiment the size in one dimension is in the range from 2 to 30 nanometer.

In embodiments of the invention the third luminescent materials may comprise quantum dots. Quantum dots are small crystals of semiconducting material generally having a width or diameter of only a few nanometers. When excited by incident light, a quantum dot emits light of a color determined by the size and material of the crystal. Light of a particular color can, therefore, be produced by adapting the size of the dots. Most known quantum dots with emission in the visible range are based on cadmium selenide (CdSe) with shell such as cadmium sulfide (CdS) and zinc sulfide (ZnS). Cadmium free quantum dots such as indium phosphide (InP), and copper indium sulfide (CuInS2) and/or silver indium sulfide (AgInS2) can also be used. Quantum dots have a narrow emission band and, thus, they emit saturated colors. Furthermore, the emission color can easily be tuned by adapting the size of the quantum dots. Any type of quantum dot known in the art may be used in the present invention, provided that it has the appropriate wavelength conversion characteristics.

In an optional alternative embodiment, the third luminescent material comprises at least one of: a narrow band red emitting phosphor which is hexafluorosilicates activated with $Mn^{4+}$ ions, or a red emitting phosphor CaS:Eu.

Optionally, the third peak wavelength is within the range from 575 nanometer to 615 nanometer. In another optional embodiment, the third peak wavelength is within the range from 590 nanometer to 610 nanometer. If the peak wavelength of the third spectral distribution is in one of these optional ranges, there are still enough wavelengths available at which the third luminescent material may emit light such that enough light is emitted at different wavelengths in the red spectral range such that a relatively high Color Rendering Index is obtained and such that the lumen equivalent of a phosphor converted LED comprising the second and third luminescent material is high enough.

Optionally, the third spectral width is larger than 80 nanometer expressed as a Full Width Half Maximum value. If the third spectral width is large enough, the second luminescent material emits enough light in the orange and the red spectral range such that a high enough Color Rendering Index is obtained and such that the amount of the third luminescent material may be kept relatively low. As discussed previously, a relative small amount of the third luminescent material results in a phosphor converted LED which is more stable and has a longer life-time.

Optionally, a wavelength difference between the third peak wavelength and the fourth peak wavelength is at least larger than 10 nanometer. If the difference between the peak wavelengths is large enough, the light emitted by the second and third luminescent material is spread along a wide enough spectral range in order to obtain a high enough Color Rendering Index. As a rule of thumb, the larger the fourth peak wavelength is, the larger the wavelength difference has to be.

Optionally, the fourth peak wavelength is larger than 610 nanometer. If the fourth peak wavelength is high enough, enough light is emitted in the red spectral range such that the Color Rendering Index remains high enough. If the fourth peak wavelength has a large enough value, there is still a relatively large portion of the orange/red spectral range available at which the second luminescent material may have its third peak wavelength.

Optionally, the fourth spectral width is smaller than 60 nanometer expressed as a Full Width Half Maximum Value. If the fourth spectral width is smaller than 60 nanometer, it is prevented that too much light is emitted in the deep red spectral range in order to prevent a reduction of the lumen equivalent of the phosphor converted LED.

Optionally, the power of the light emitted by the fourth luminescent material is less than 20% of the power of all light emitted by the phosphor converted Light Emitting Diode. If the power of the light emitted by the fourth luminescent material, expressed as a portion of the total power emitted by the phosphor converted LED, is low enough, the amount of the fourth material to be used is relatively low and the amount of light emitted in the deep red spectral range is relatively low. Thus, the phosphor converted LED is more stable and has a relatively high lumen equivalent.

Optionally, the first luminescent material comprises a green emitting phosphor which is one of garnet $Y_3Al_5O_{12}$:$Ce^{3+}$, $(Lu_{0.5},Y_{0.5})_3Al_5O_{12}$:$Ce^{3+}$, or Y substituted with Gd or Al substituted with Ga, or a SiAlON phosphor. It has been proved that these materials are suitable for use in the invention to obtain a relatively high Color Rendering Index, a relatively high lumen equivalent, and a relatively stable phosphor converted LED.

Optionally, the first peak wavelength is in the range of 440-460 nanometer. Blue emitting Light Emitting Diodes which emit light at the specified wavelength are relatively cheap and relatively efficient. Additionally, this light is well absorbed by the respective luminescent materials of the invention.

According to the second aspect of the invention, a lamp is provided which comprises a phosphor converted LED according to the first aspect of the invention. The lamp according to the second aspect of the invention may be a retro-fit light bulb or a retro-fit light tube. In other embodiments, the lamp has another shape, for example, the shape of a box or troffer.

According to the third aspect of the invention, a luminaire is provided which comprises a phosphor converted LED according to the first aspect of the invention or which comprises a lamp according to the second aspect of the invention.

The lamp according to the second aspect of the invention and the luminaire according to the third aspect of the invention provide the same benefits as the phosphor converted LED according to the first aspect of the invention and have similar embodiments with similar effects as the corresponding embodiments of the phosphor converted LED.

These and other aspects of the invention are apparent from and will be elucidated with reference to the embodiments described hereinafter.

It will be appreciated by those skilled in the art that two or more of the above-mentioned options, implementations, and/or aspects of the invention may be combined in any way deemed useful.

Modifications and variations of the phosphor converted Light Emitting Diode, the lamp, and/or of the luminaire, which correspond to the described modifications and variations of the phosphor converted Light Emitting Diode, can be carried out by a person skilled in the art on the basis of the present description.

Figure 1A:
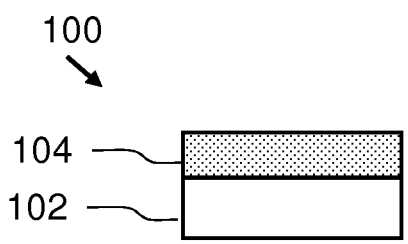
FIGS. 1a to 1c schematically present cross-sectional views of different structures of phosphor converted Light Emitting diodes according to the first aspect of the invention, FIG. 2a schematically presents a first light emission spectrum of a first embodiment of a phosphor converted LED, FIG. 2b schematically presents a second light emission spectrum of a second embodiment of a phosphor converted LED, FIG. 3a schematically presents a third light emission spectrum of a third embodiment of a phosphor converted LED, FIG. 3b schematically presents a fifth light emission spectrum of a fourth embodiment of a phosphor converted LED, FIG. 4a schematically presents a sixth light emission spectrum of a fifth embodiment of a phosphor converted LED, FIG. 4b schematically presents a seventh light emission spectrum of a sixth embodiment of a phosphor converted LED, FIG. 5 schematically presents a seventh light emission spectrum of a seventh embodiment of a phosphor converted LED, FIGS. 6a to 6c schematically present different embodiments of a lamp, and FIG. 7 schematically presents an embodiment of a luminaire.

It should be noted that items denoted by the same reference numerals in different Figures have the same structural features and the same functions, or are the same signals. Where the function and/or structure of such an item have been explained, there is no necessity for repeated explanation thereof in the detailed description.

The Figures are purely diagrammatic and not drawn to scale. Particularly for clarity, some dimensions are exaggerated strongly.

DETAILED DESCRIPTION

A first embodiment is shown in FIG. 1a. FIG. 1a presents a phosphor converted Light Emitting Diode (LED) 100. The phosphor converted Light Emitting diode 100 comprises a Light Emitting Diode (LED) 102 and a luminescent element 104. The luminescent element 104 is provided directly on top of the LED, more in particular, on top of a surface of the LED which emits light.

The LED 102 emits light in a first spectral distribution which has a first peak wavelength in the blue spectral range. The blue spectral range comprises light with a wavelength in the range from 445 nanometer to 495 nanometer. The luminescent element 104 comprises a first luminescent material, a second luminescent material and a third luminescent material. The different luminescent materials are provided as a mix in the luminescent element 104. The luminescent element 104 receives light emitted by the LED. The first luminescent material is configured to absorb a portion of the light of the first spectral distribution and to convert a portion of the absorbed light towards light of a second spectral distribution which has a second peak wavelength in the green spectral range. The green spectral range comprises light with a wavelength in the range from 495 nanometer to 570 nanometer. The second luminescent material is configured to absorb a portion of the light of the first spectral distribution and to convert a portion of the absorbed light towards light of a third spectral range which has a third spectral width and has a third peak wavelength. The third luminescent material is configured to absorb a portion of the light of the first spectral distribution and to convert a portion of the absorbed light towards light of a fourth spectral range which has a fourth spectral width and has a fourth peak wavelength. The third peak wavelength and the fourth peak wavelength are in the orange/red spectral range, which means that each one of the third and the fourth peak wavelength are in the orange spectral range or in the red spectral range. The orange spectral range comprises light with a wavelength in the range from 590 nanometer to 620 nanometer. The red spectral range comprises light with a wavelength in the range from 620 nanometer to 750 nanometer. Thus, the orange/red spectral range comprises light in the spectral range from 590 to 750 nanometer. Furthermore, the third peak wavelength is smaller than the fourth peak wavelength. Additionally, the third spectral width is larger than the fourth spectral width. It is to be noted that the luminescent element 104 may be based on a matrix polymer, such as for example, Polymethyl methacrylate (PMMA), Polyethylene terephthalate (PET), Polyethylene naphthalate (PEN) or polycarbonate (PC). Particles and/or molecules of the first luminescent material, the second luminescent material and the third luminescent material may be dispersed and/or dissolved in the matrix polymer. In other embodiments, the luminescent element 104 may be an ceramic element 104 when inorganic luminescent materials are used.

Figure 1B:
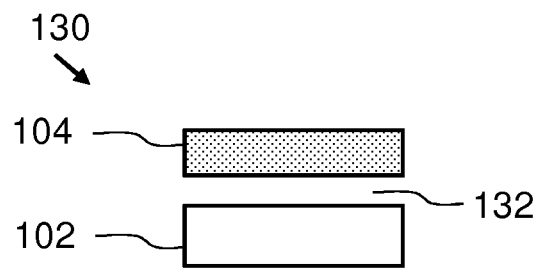

FIG. 1b schematically present an alternative structure of a phosphor converted LED 130. The phosphor converted LED 130 is similar to the phosphor converted LED 100 of FIG. 1a, however, a difference is that the luminescent element 104 is not directly arranged on top of the LED 102, but a gap 132 is present between the LED 102 and the luminescent element 104. The gap may have a depth of, for example, 500 micrometer, but may also have a depth of a few millimeter.

Figure 1C:
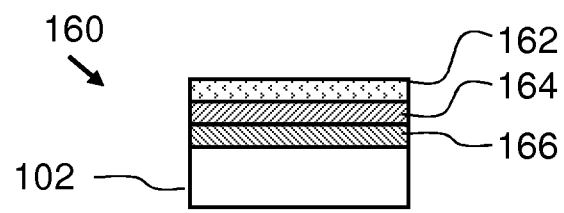

FIG. 1c schematically presents another alternative structure of a phosphor converted LED 160. The phosphor converted LED 160 is similar to the phosphor converted LED 100 of FIG. 1a, however, a difference is that phosphor converted LED 160 does not have the luminescent element 104 of FIG. 1a, but has a stack of luminescent layers which is arranged on top of a light emitting surface of the LED 102. The stack of luminescent layers comprises a first layer 166 with one of the first, the second, or the third luminescent materials. The first layer 166 is provided directly on the light emitting surface of the LED 102. The stack further comprises a second layer 164 which is interposed between the first layer 166 and a third layer 162. The second layer 164 comprises another one of the first, the second or the third luminescent material. The third layer 162 comprises a further luminescent material of the group of the first, the second and the third luminescent materials. In other words, in each one of the first, the second and the third layer, is arranged one of the luminescent materials of the group of the first, the second and the third luminescent materials. Each one of the layers may be based on a matrix polymer in which the respective luminescent material is dispersed or dissolved. Each one of the layers may also be a ceramic layer if the respective luminescent material is an inorganic compound. It is further to be noted that, in FIG. 1c, the stack of luminescent layers is provided on top of the LED 102, however, in an alternative embodiment, there is a gap present between the LED 102 and stack of luminescent layers.

In the following, different embodiments of phosphor converted LEDs are discussed. It is to be noted that in the following embodiment are mainly related to the specific luminescent materials used in the phosphor converted LEDs. The phosphor converted LEDs of the following embodiments may have the structure of one of the above discussed embodiments of the structure of the phosphor converted LEDs.

Embodiment 1

The phosphor converted LED of embodiment 1 comprises a blue light emitting LED which emits a first spectral distribution with a peak wavelength of 449 nanometer. A green emitting phosphor with the formula $Y_3Al_5O_{12}:Ce^{3+}$ is used as a first luminescent material. The second luminescent material is a red emitting phosphor from the BSSNE 2-5-8 system. The second luminescent material emits light in a light emission distribution with a peak wavelength of 597 nanometer and with a spectral width of 91 nanometer, expressed as a Full Width Half Maximum value (FWHM). A phosphor from the BSSNE 2-5-8 system has a general formula of $M_2Si_5N_8:Eu^{2+}$ (M=60% Ba, 36% Sr, 3% Ca) with 1% Eu. The third luminescent material comprises Quantum Dots which emit according to a spectral distribution which has a peak wavelength of 612 nanometer and which has a spectral width of 30 nm (FWHM).

Figure 2A:
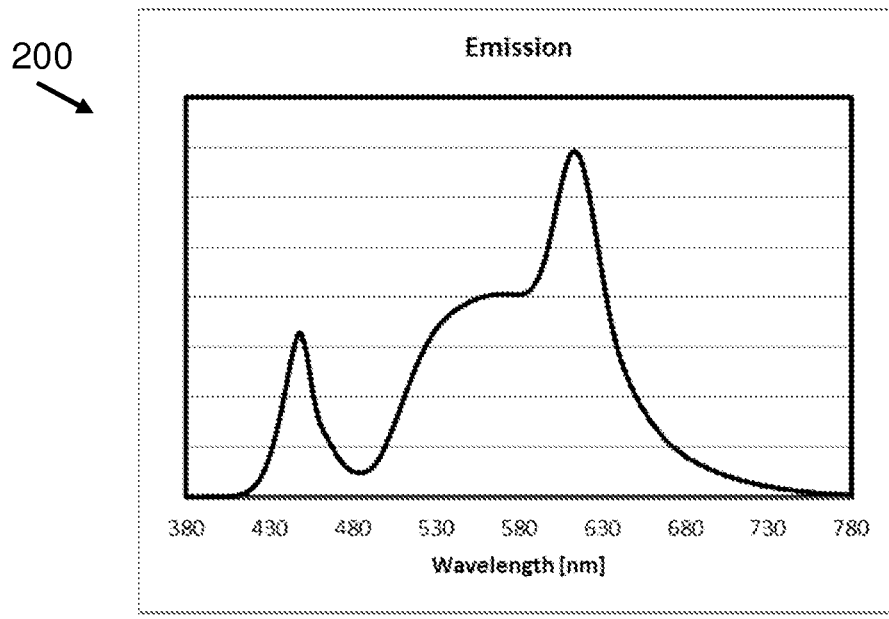

The mixture of luminescent materials is chosen such that the emitted light by the phosphor converted LED has a correlated color temperature (CCT) of 3000 Kelvin. Such a phosphor converted LED has a light emission distribution which is presented in FIG. 2a. The x-axis of the chart represents the wavelength of the light and the y-axis the (normalized) intensity of the respective wavelengths. Further, it is known that the phosphor converted LED according to this embodiment has a Color Rendering Index (CRI) of 82.2 (which is expressed as an Ra value). The Lumen Equivalent of this phosphor converted LED is 355.3 lm/W and the light power emitted by the phosphor converted LED originates for 12.9% directly from the LED, for 61.0% from the first luminescent material (green), for 8.6% from the second luminescent material (orange/red emitting BSSNE phosphor) and for 17.5% from the quantum dots.

When this embodiment is compared to the second embodiment discussed in the background of the art section (phosphor converted LED with quantum dots), especially the amount of Quantum Dots is significantly reduced. The red emitting quantum dots are not stable enough and by reducing their required amount, the total stability of the phosphor converted LED increases. Also, possible environmental issues of Quantum Dots are reduced (when the Quantum Dots comprise, for example, Cadmium or Selenium).

Embodiment 2

The phosphor converted LED of embodiment 2 comprises a blue light emitting LED which emits a first spectral distribution with a peak wavelength of 449 nanometer. A green emitting phosphor with the formula $Y_3Al_5O_{12}:Ce^{3+}$ is used as a first luminescent material. The second luminescent material is a red emitting phosphor from the BSSNE 2-5-8 system. The second luminescent material emits light in a light emission distribution with a peak wavelength of 605 nanometer and with a spectral width of 96 nanometer FWHM. The third luminescent material comprises Quantum Dots with emit according to a spectral distribution which has a peak wavelength of 612 nanometer and which has a spectral width of 30 nm (FWHM).

Figure 2B:
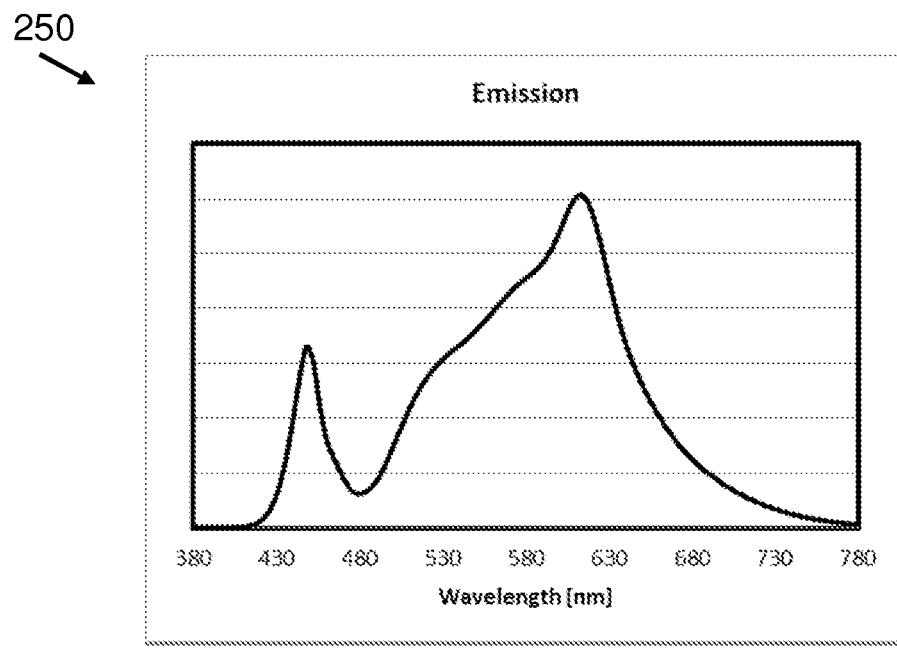

The mixture of luminescent materials is chosen such that the emitted light by the phosphor converted LED has a correlated color temperature (CCT) of 3000 Kelvin. Such a phosphor converted LED has a light emission distribution which is presented in FIG. 2b. Further, it is known that the phosphor converted LED according to this embodiment has a Color Rendering Index (CRI) of 81.8 (which is expressed as the Ra value). The Lumen Equivalent of this phosphor converted LED is 340 lm/W and the light power emitted by the phosphor converted LED originates for 11.9% directly from the LED, for 46.7% from the first luminescent material (green), for 33.3% from the second luminescent material (orange/red emitting BSSNE phosphor) and for 8.2% from the quantum dots.

Embodiment 3

The phosphor converted LED of embodiment 3 comprises a blue light emitting LED which emits a first spectral distribution with a peak wavelength of 449 nanometer. A green emitting phosphor with the formula $Y_3Al_5O_{12}:Ce^{3+}$ is used as a first luminescent material. The second luminescent material is a red emitting phosphor from the BSSNE 2-5-8 system. The second luminescent material emits light in a light emission distribution with a peak wavelength of 580 nanometer and with a spectral width of 90.3 nanometer FWHM. The third luminescent material comprises Quantum Dots which emit according to a spectral distribution which has a peak wavelength of 630 nanometer and which has a spectral width of 25 nm (FWHM).

Figure 3A:
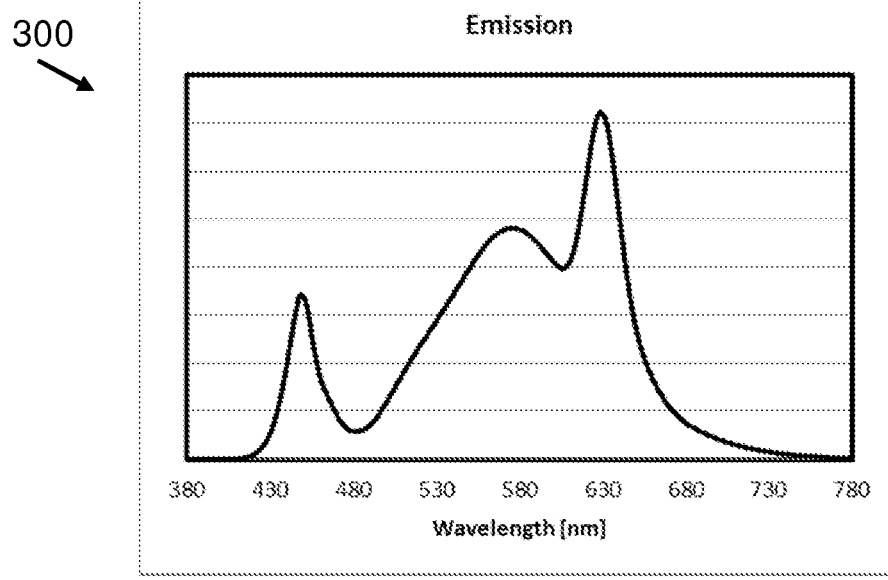

The mixture of luminescent materials is chosen such that the emitted light by the phosphor converted LED has a correlated color temperature (CCT) of 3000 Kelvin. Such a phosphor converted LED has a light emission distribution which is presented in FIG. 3a. Further, it is known that the phosphor converted LED according to this embodiment has a Color Rendering Index (CRI) of 81.6 (which is expressed as the Ra value).

Embodiment 4

In a first comparative example, in the context of embodiment 4 of the invention, a first comparative phosphor converted LED is discussed which does not have the third luminescent material. This first comparative phosphor converted LED comprises a blue light emitting LED which emits a spectral distribution with a peak wavelength of 449 nanometer. A green emitting phosphor with the formula $(Lu_{0.5}, Y_{0.5})_3Al_5O_{12}:Ce^{3+}$ is used as a luminescent material. A red emitting $(Sr,Ca)AlSiN_3Eu^{2+}$ activated phosphor with a peak emission at 635 nanometer and a spectral width of 101 nanometer FWHM is used in the first comparative phosphor converted LED. The mixture of luminescent materials is chosen such that the emitted light by the first comparative phosphor converted LED has a correlated color temperature (CCT) of 2700 Kelvin. Further, it is known that the first comparative phosphor converted LED according to this embodiment has a Color Rendering Index (CRI) of 90.2 (which is expressed as the RA value). The Lumen Equivalent of this phosphor converted LED is 278 lm/W and the light power emitted by the phosphor converted LED originates for 7.8% directly from the LED, for 40.0% from the green emitting phosphor and for 52.3% from the red emitting phosphor.

In a second comparative example, in the context of embodiment 4 of the invention, a second comparative phosphor converted LED is discussed which does not have the second luminescent material. This second comparative phosphor converted LED comprises a blue light emitting LED which emits a spectral distribution with a peak wavelength of 449 nanometer. A green emitting phosphor with the formula $(Lu_{0.5}, Y_{0.5})_3Al_5O_{12}:Ce^{3+}$ is used as a luminescent material. Red emitting Quantum Dots, which have a peak emission at 620 nanometer and a spectral width of 25 nanometer FWHM, are used in the second comparative phosphor converted LED. The mixture of luminescent materials is chosen such that the emitted light by the second comparative phosphor converted LED has a correlated color temperature (CCT) of 2700 Kelvin. Further, it is known that the second comparative phosphor converted LED according to this embodiment has a Color Rendering Index (CRI) of 90.2 (which is expressed as the Ra value). The Lumen Equivalent of this phosphor converted LED is 350 lm/W and the light power emitted by the phosphor converted LED originates for 9.4% directly from the LED, for 56.1% from the green emitting phosphor and for 34.4% from the red emitting phosphor.

The phosphor converted LED of embodiment 4 of the first aspect of the invention comprises a blue light emitting LED which emits a first spectral distribution with a peak wavelength of 449 nanometer. A green emitting phosphor with the formula $(Lu_{0.5}, Y_{0.5})_3Al_5O_{12}:Ce^{3+}$ is being used as a first luminescent material. The second luminescent material is a red emitting phosphor which has a light emission distribution with a peak wavelength of 580 nanometer and with a spectral width of 91 nanometer FWHM. The second luminescent material comprises M2Si5N8:Eu2+ (M=90% Ba, 10% Sr) phosphor with 0.4% Eu. The third luminescent material comprises Quantum Dots which emit according to a spectral distribution which has a peak wavelength of 630 nanometer and which has a spectral width of 25 nm (FWHM).

Figure 3B:
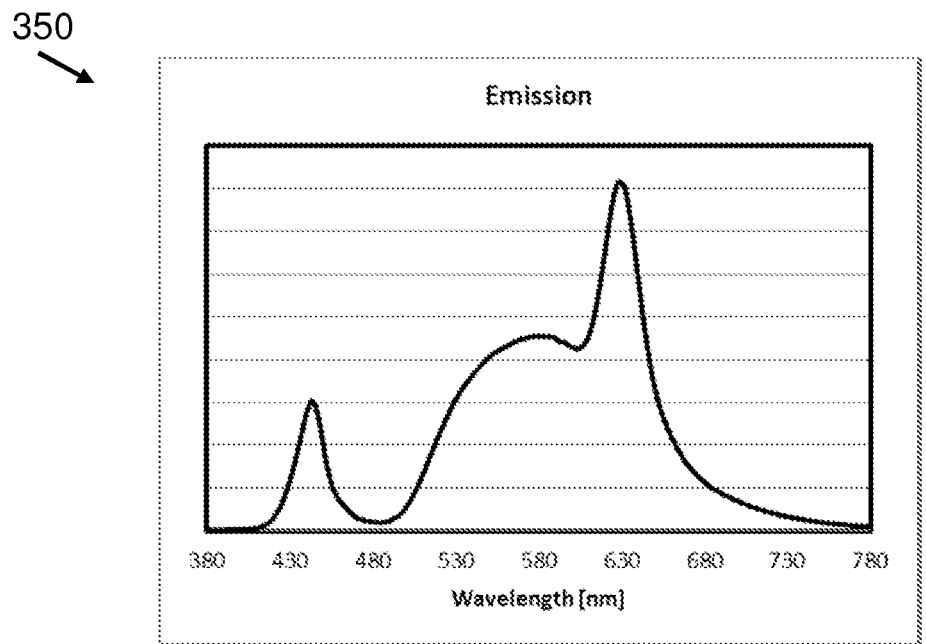

The mixture of luminescent materials is chosen such that the emitted light by the phosphor converted LED has a correlated color temperature (CCT) of 2700 Kelvin. Such a phosphor converted LED has a light emission distribution which is presented in FIG. 3b. Further, it is known that the phosphor converted LED according to this embodiment has a Color Rendering Index (CRI) of 90.5 (which is expressed as the Ra value). The Lumen Equivalent of this phosphor converted LED is 336 lm/W and the light power emitted by the phosphor converted LED originates for 9.3% directly from the LED, for 41.1% from the first luminescent material (green), for 23.4% from the second luminescent material (orange/red emitting phosphor) and for 26.2% from the quantum dots.

When the phosphor converted LED is compared to the first comparative phosphor converted LED, it is seen that the lumen equivalent is substantially higher. When the phosphor converted LED is compared to the second comparative phosphor converted LED, it is seen that the Color Rendering Index has about the same value, that the lumen equivalent is at about the same level, and that the contribution of the quantum dots to the light emission is relatively low, and, thus, that the amount of quantum dots in the phosphor converted LED of embodiment 4 is significantly lower than the amount of quantum dots in the second comparative example.

Embodiment 5

The fifth embodiment of a phosphor converted LED is being simulated in a software program in order to get in insight in the use of a specific narrow band emitting red phosphor which is being disclosed in patent application US2006/0169998. In US2006/0169998 it has been disclosed that hexafluorosilicates activated with $Mn^{4+}$ ions show a narrow red emission at about 630 nm peak.

The phosphor converted LED of embodiment 5 comprises a blue light emitting LED which emits a first spectral distribution with a peak wavelength of 449 nanometer. A green emitting phosphor with the formula $Y_3Al_5O_{12}:Ce^{3+}$ is used as a first luminescent material. The second luminescent material is a red emitting phosphor with a peak wavelength of 590 nanometer and with a spectral width of 87 nanometer FWHM. The second luminescent material comprises $M_2Si_5N_8:Eu^{2+}$ (M=60% Ba, 40% Sr) with 0.4% Eu. The third luminescent material comprises $K_2SiF_6:Mn$ as described in US2006/0169998 (which has a narrow band light emission in the red spectral range).

Figure 4A:
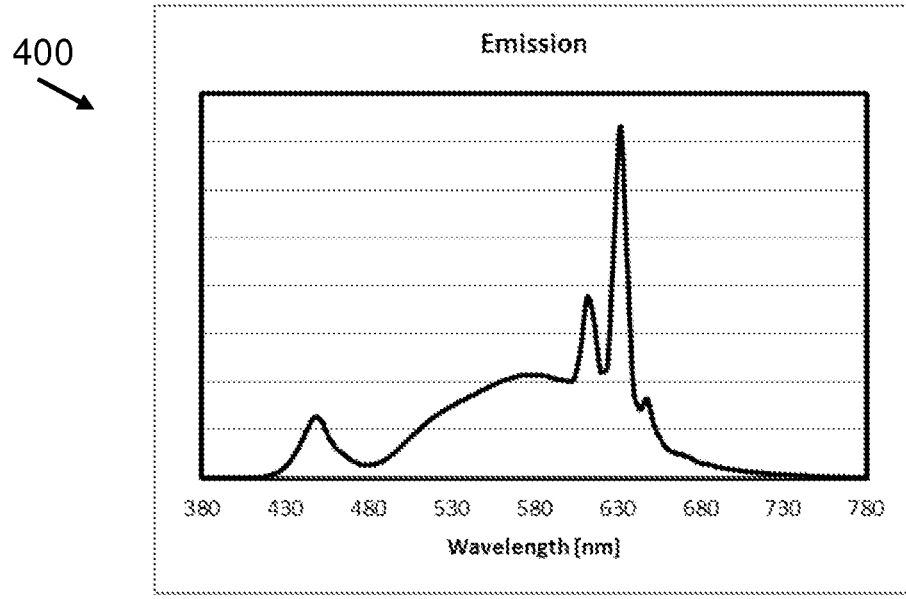

The mixture of luminescent materials is chosen such that the emitted light by the phosphor converted LED has a correlated color temperature (CCT) of 2700 Kelvin. Such a phosphor converted LED has a light emission distribution which is presented in FIG. 4a. Further, it is known that the phosphor converted LED according to this embodiment has a Color Rendering Index (CRI) of 90.7 (which is expressed as the Ra value). The Lumen Equivalent of this phosphor converted LED is 344 lm/W and the light power emitted by the phosphor converted LED originates for 9.5% directly from the LED, for 45.5% from the first luminescent material (green), for 19.9% from the second red emitting luminescent material and for 25.1% from the phosphor $K_2SiF_6:Mn$.

Embodiment 6

The sixth embodiment of a phosphor converted LED is being simulated in order to get an insight in the use of a specific narrow band emitting red phosphor which is being disclosed in patent application US2006/0169998. In US2006/0169998 it has been disclosed that hexafluorosilicates activated with $Mn^{4+}$ ions show a narrow red emission at about 630 nm peak.

The phosphor converted LED of embodiment 6 comprises a blue light emitting LED which emits a first spectral distribution with a peak wavelength of 449 nanometer. A green emitting phosphor with the formula $Y_3Al_5O_{12}:Ce^{3+}$ is used as a first luminescent material. The second luminescent material is a red emitting phosphor with a peak wavelength of 600 nanometer and with a spectral width of 87 nanometer FWHM. The second luminescent material comprises $M_2Si_5N_8:Eu^{2+}$ (M=50% Ba, 50% Sr) with 1% Eu. The third luminescent material comprises $K_2SiF_6:Mn$ as described in US2006/0169998 (which has a narrow band light emission in the red spectral range). Compared to Embodiment 6, the amount of the third luminescent material is reduced.

Figure 4B:
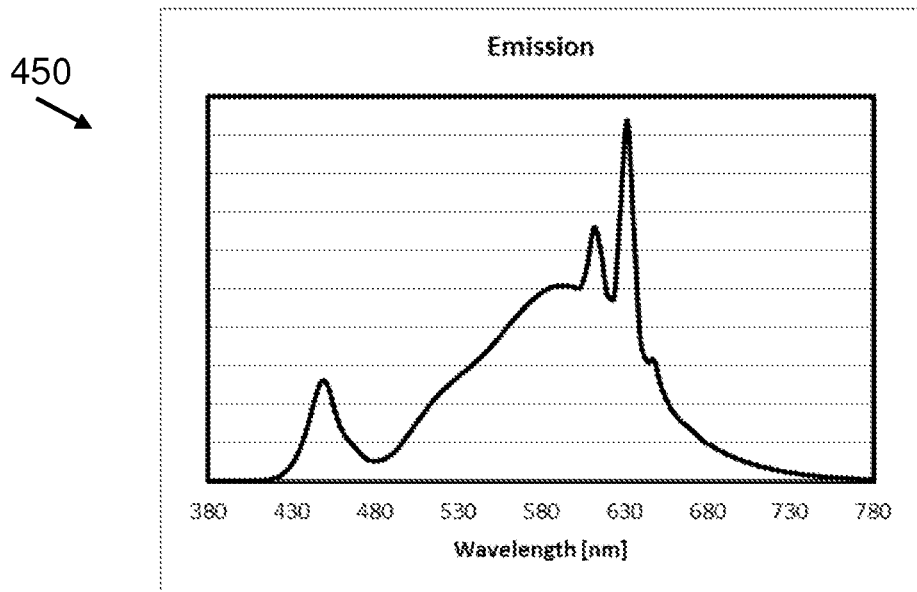

The mixture of luminescent materials is chosen such that the emitted light by the phosphor converted LED has a correlated color temperature (CCT) of 2700 Kelvin. Such a phosphor converted LED has a light emission distribution which is presented in FIG. 4b. Further, it is known that the phosphor converted LED according to this embodiment has a Color Rendering Index (CRI) of 81.5 (which is expressed as the Ra value). The Lumen Equivalent of this phosphor converted LED is 346 lm/W and the light power emitted by the phosphor converted LED originates for 9.6% directly from the LED, for 41.6% from the first luminescent material (green), for 36.3% from the second red emitting luminescent material and for 12.5% from the phosphor $K_2SiF_6:Mn$.

Embodiment 7

The phosphor converted LED of embodiment 7 comprises a blue light emitting LED which emits a first spectral distribution with a peak wavelength of 449 nanometer. A green emitting phosphor with the formula $(Lu_{0.5}, Y_{0.5})_3Al_5O_{12}:Ce^{3+}$ is being used as a first luminescent material. The second luminescent material is a red emitting phosphor with a peak wavelength of 612 nanometer and with a spectral width of 87 nanometer FWHM. The second luminescent material comprises $M_2Si_5N_8:Eu^2$ (M=50% Ba, 50% Sr) with 3% Eu. The third luminescent material comprises CaS:Eu which has a light emission distribution with a peak wavelength at 650 nanometer and a spectral width of 66 nm FWHM.

Figure 5:
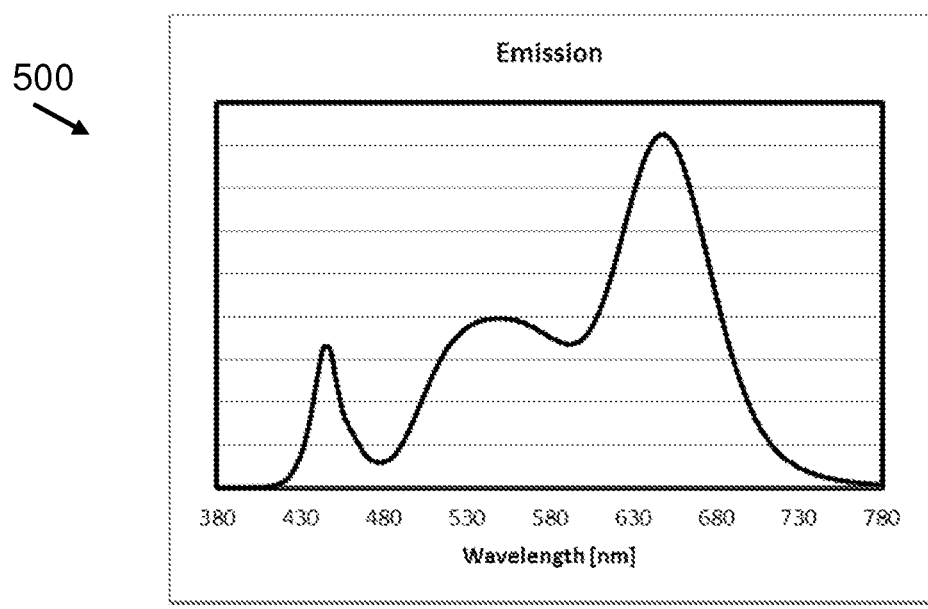

The mixture of luminescent materials is chosen such that the emitted light by the phosphor converted LED has a correlated color temperature (CCT) of 2700 Kelvin. Such a phosphor converted LED has a light emission distribution which is presented in FIG. 5. Further, it is known that the phosphor converted LED according to this embodiment has a Color Rendering Index (CRI) of 84.6 (which is expressed as the Ra value). The Lumen Equivalent of this phosphor converted LED is 313 lm/W and the light power emitted by the phosphor converted LED originates for 10.7% directly from the LED, for 45.8% from the first luminescent material (green), for 30.0% from the second red emitting luminescent material and for 13.5% from the phosphor CaS:Eu.

On basis of the discussed embodiments of a phosphor converted LED one may conclude that by combining a broadband emitting red phosphor with a narrow band red light emitting luminescent material in a phosphor converted LED which has a blue emitting LED and a green phosphor, a phosphor converted LED may be obtained which has a relatively high Color Rendering Index, have a relatively high lumen equivalent, and have a relatively long life time because of the use of a relatively low amount of narrowband red emitting luminescent materials.

Figure 6A:
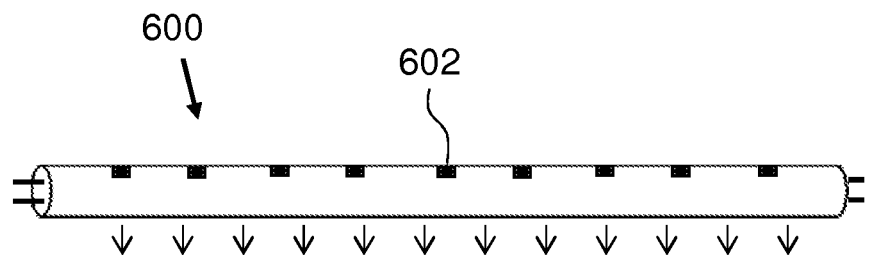

FIG. 6a schematically shows a first embodiment of a lamp in accordance with the second aspect of the invention. The lamp is a retrofit light-tube 600. The light-tube 600 comprises, in a lateral direction, a plurality of phosphor converted LEDs 602. The glass of the light-tube 600 is the light exit window and the phosphor converted LEDs 602 emit light towards the light exit window.

Figure 6B:
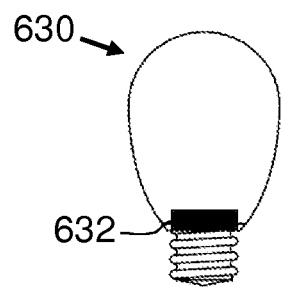

FIG. 6b schematically shows a second embodiment of a lamp which is a retrofit light bulb 630. The retrofit light bulb 630 comprises a base on which, at least one, phosphor converted LED 632 in accordance with the first aspect of the invention is provided.

Figure 6C:
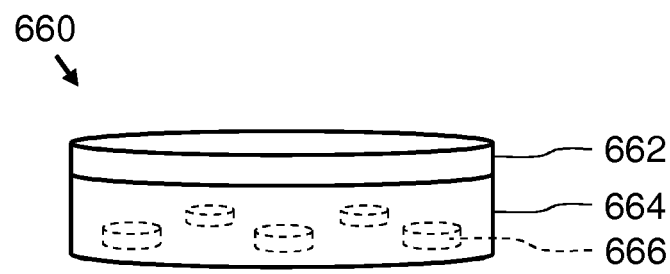

FIG. 6c schematically shows a third embodiment of a lamp which is a LED unit 660. The LED unit 660 comprises a housing 664 which has a cylindrical shape. The housing 664 encloses a cavity in which a plurality of phosphor converted LEDs 666 according to the first aspect of the invention are provided. The light exit window is formed by a layer 662 which closes the cavity. The layer 662 may be a diffusing layer. Alternatively, the layer 662 may be a transparent layer.

Figure 7:
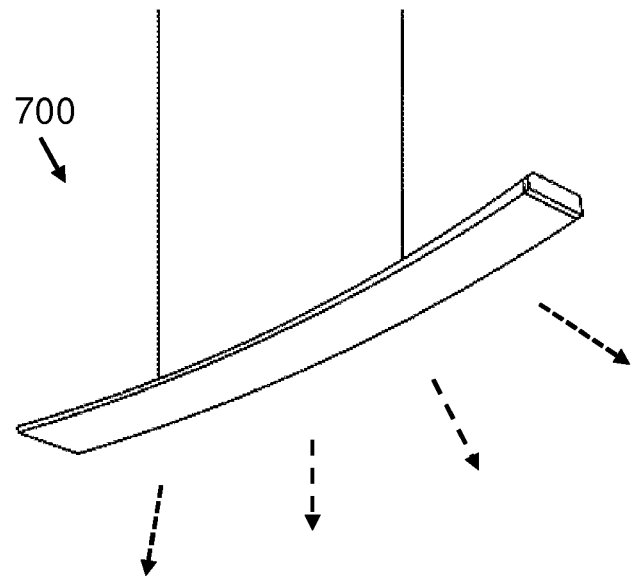

FIG. 7 schematically shows a luminaire 700 according to the third aspect of the invention. The luminaire comprises one or more light emitting assemblies according to the first aspect of the invention or comprises a lamp according to the second aspect of the inventions.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. Use of the verb "comprise" and its conjugations does not exclude the presence of elements or steps other than those stated in a claim. The article "a" or "an" preceding an element does not exclude the presence of a plurality of such elements. The invention may be implemented by means of hardware comprising several distinct elements. In the device claim enumerating several means, several of these means may be embodied by one and the same item of hardware. The mere fact that certain measures are recited in mutually different dependent claims does not indicate that a combination of these measures cannot be used to advantage.

The invention claimed is:

1. A phosphor converted Light Emitting Diode comprising:
a Light Emitting Diode emitting a first spectral distribution having a first peak wavelength in the blue spectral range between 445 nanometers and 495 nanometers,
a first luminescent material configured for absorbing a portion of the light of the first spectral distribution and for converting at least a portion of the absorbed light into light of a second spectral distribution, the second spectral distribution having a second peak wavelength in the green spectral range,
a second luminescent material configured for absorbing a portion of the light of the first spectral distribution and/or a portion of the second spectral distribution and for converting at least a portion of the absorbed light into light of a third spectral distribution, the third spectral distribution having a third spectral width and having a third peak wavelength,
a third luminescent material configured for absorbing a portion of the light of at least one of the first spectral distribution, second spectral distribution, and the third spectral distribution and for converting at least a portion of the absorbed light into light of a fourth spectral distribution, the fourth spectral distribution having a fourth spectral width and having a fourth peak wavelength,
wherein the third peak wavelength and the fourth peak wavelength are in the orange/red spectral range, the third peak wavelength being smaller than the fourth peak wavelength, and the third spectral width being larger than the fourth spectral width; and
wherein the second and/or third luminescent material comprises a red emitting Eu2+ phosphor.

2. A phosphor converted Light Emitting Diode according to claim 1, wherein the second luminescent material comprises the material M2SisNs:Eu2+M2Si5N8:Eu2 1 in which M is an alkaline earth metal.

3. A phosphor converted Light Emitting Diode according to claim 1, wherein the second luminescent material comprises the material (Ca,Sr)AlSiN3.

4. A phosphor converted Light Emitting Diode according to claim 1, wherein the third luminescent material comprising at least one of:
particles showing quantum confinement and having at least in one dimension a size in the nanometer range,
a narrow band red emitting phosphor which is hexafluorosilicates activated with $Mn^{4+}$ ions, and
a red emitting phosphor CaS:Eu.

5. A phosphor converted Light Emitting Diode according to claim 1, wherein the third peak wavelength is within the range from 575 nanometers to 615 nanometers.

6. A phosphor converted Light Emitting Diode according to claim 1, wherein the third spectral width is larger than 80 nanometers expressed as a Full Width Half Maximum value.

7. A phosphor converted Light Emitting Diode according to claim 1, wherein a wavelength difference between the third peak wavelength and the fourth peak wavelength is at least larger than 10 nanometers.

8. A phosphor converted Light Emitting Diode according to claim 1, wherein the fourth peak wavelength is larger than 610 nanometers.

9. A phosphor converted Light Emitting Diode according to claim 1, wherein the fourth spectral width is smaller than 60 nanometers expressed as a Full Width Half Maximum Value.

10. A phosphor converted Light Emitting Diode according to claim 1, wherein the power of the light emitted by the third luminescent material is less than 20% of the power of all light emitted by the phosphor converted Light Emitting Diode.

11. A phosphor converted Light Emitting Diode according to claim 1, wherein the first luminescent material comprises a green emitting phosphor which is one of garnet $Y_3Al_5O_{12}:Ce^{3+}$, a SiAlON phosphor or $(Lu_{0.5},Y_{0.5})_3Al_5O_{12}:Ce^{3+}$, or Y substituted with Gd or Al substituted with Ga, or a mixture of garnets.

12. A lamp comprising a phosphor converted Light Emitting Diode according to claim 1.

13. A luminaire comprising a phosphor converted Light Emitting Diode according to claim 1.

14. A luminaire comprising a lamp according to claim 12.

* * * * *